United States Patent
Chang et al.

(10) Patent No.: US 8,637,149 B2
(45) Date of Patent: Jan. 28, 2014

(54) COATED ARTICLE HAVING ANTIBACTERIAL EFFECT AND METHOD FOR MAKING THE SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Cong Li, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 164 days.

(21) Appl. No.: 13/198,402

(22) Filed: Aug. 4, 2011

(65) Prior Publication Data
US 2012/0244375 A1 Sep. 27, 2012

(51) Int. Cl.
*B32B 9/00* (2006.01)

(52) U.S. Cl.
USPC ............ 428/336; 428/469; 428/472; 428/698

(58) Field of Classification Search
USPC .......................... 428/336, 343, 469, 472, 698
See application file for complete search history.

(56) References Cited

U.S. PATENT DOCUMENTS

| | | | | |
|---|---|---|---|---|
| 6,830,817 | B2 * | 12/2004 | Stachowiak | 428/432 |
| 7,022,384 | B2 * | 4/2006 | Fujii et al. | 359/360 |
| 7,951,473 | B2 * | 5/2011 | Maschwitz | 428/699 |
| 8,231,977 | B2 * | 7/2012 | Roquiny et al. | 428/433 |

FOREIGN PATENT DOCUMENTS

| | | |
|---|---|---|
| CN | 101067196 A | 11/2007 |
| CN | 101220454 A | 7/2008 |

* cited by examiner

*Primary Examiner* — Archene Turner
(74) *Attorney, Agent, or Firm* — Altis Law Group, Inc.

(57) ABSTRACT

A coated article is described. The coated article includes a substrate, a bonding layer formed on the substrate, a plurality of nickel-chromium-nitrogen layers and a plurality of silver-cerium alloy layers formed on the bonding layer. The bonding layer is a nickel-chromium layer. Each nickel-chromium-nitrogen layer interleaves with one silver-cerium alloy layer. One of the nickel-chromium-nitrogen layers is directly formed on the bonding layer. A method for making the coated article is also described.

9 Claims, 2 Drawing Sheets

COATED ARTICLE HAVING ANTIBACTERIAL EFFECT AND METHOD FOR MAKING THE SAME

CROSS-REFERENCE TO RELATED APPLICATIONS

This application is one of the five related co-pending U.S. patent applications listed below. All listed applications have the same assignee. The disclosure of each of the listed applications is incorporated by reference into the other listed applications.

| Attorney Docket No. | Title | Inventors |
| --- | --- | --- |
| US 37027 | COATED ARTICLE HAVING ANTIBACTERIAL EFFECT AND METHOD FOR MAKING THE SAME | HSIN-PEI CHANG et al. |
| US 37028 | COATED ARTICLE HAVING ANTIBACTERIAL EFFECT AND METHOD FOR MAKING THE SAME | HSIN-PEI CHANG et al. |
| US 37029 | COATED ARTICLE HAVING ANTIBACTERIAL EFFECT AND METHOD FOR MAKING THE SAME | HSIN-PEI CHANG et al. |
| US 37138 | COATED ARTICLE HAVING ANTIBACTERIAL EFFECT AND METHOD FOR MAKING THE SAME | HSIN-PEI CHANG et al. |
| US 38935 | COATED ARTICLE HAVING ANTIBACTERIAL EFFECT AND METHOD FOR MAKING THE SAME | HSIN-PEI CHANG et al. |

BACKGROUND

1. Technical Field

The present disclosure relates to coated articles, particularly to a coated article having an antibacterial effect and a method for making the coated article.

2. Description of Related Art

To make the living environment more hygienic and healthy, a variety of antibacterial products have been produced by coating antibacterial metal films on the substrates of the products. The metal may be copper (Cu), zinc (Zn), or silver (Ag). However, the coated metal films are soft and bond poorly to the substrate, so the metal films are prone to abrasion. Moreover, the metal ions within the metal films rapidly dissolve from killing bacterium, so the metal films have a short lifespan.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
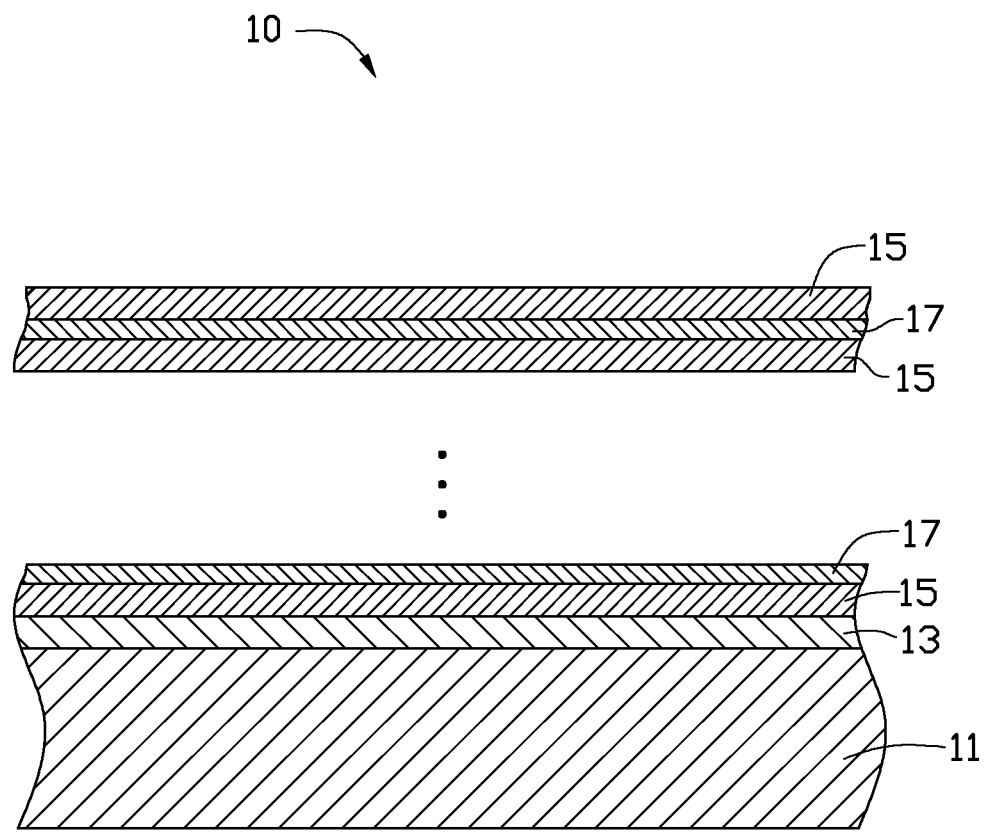
FIG. 1 is a cross-sectional view of an exemplary embodiment of a coated article.

FIG. 1 shows a coated article 10 according to an exemplary embodiment. The coated article 10 includes a substrate 11, a bonding layer 13 formed on the substrate 11, a plurality of nickel-chromium-nitrogen (Ni—Cr—N) layers 15 and a plurality of silver-cerium (Ag—Ce) alloy layers 17 formed on the bonding layer 13. Each Ni—Cr—N layer 15 alternates/interleaves with one Ag—Ce alloy layer 17. One of the Ni—Cr—N layers 15 is directly formed on the bonding layer 13. Furthermore, one of the Ni—Cr—N layers 15 forms the outermost layer of the coated article 10. Therefore, there is typically one more Ni—Cr—N layer 15 than there are Ag—Ce alloy layers 17. The total thickness of the Ni—Cr—N layers 15 and the Ag—Ce alloy layers 17 may be about 2 μm-3.2 μm. The total number of the Ni—Cr—N layers 15 may be about 15 layers to about 21 layers. The total number of the Ag—Ce alloy layers 17 may be about 14 layers to about 20 layers.

The substrate 11 may be made of stainless steel, but is not limited to stainless steel.

The bonding layer 13 may be a nickel-chromium (Ni—Cr) alloy layer formed on the substrate 11 by vacuum sputtering. The bonding layer 13 has a thickness of about 150 nm-250 nm.

The Ni—Cr—N layers 15 may be formed by vacuum sputtering. Each Ni—Cr—N layer 15 may have a thickness of about 40 nm-80 nm. Each Ni—Cr—N layer 15 contains by atomic percentage, about 30%-45% nickel, about 40%-55% chromium, and about 5%-15% nitrogen. The Ni—Cr—N layers 15 have a porous structure. Furthermore, the Ni—Cr—N layers 15 are hard coatings and abrasion resistant, which provide the coated article 10 with high hardness and good abrasion resistance.

The Ag—Ce alloy layers 17 may be formed by vacuum sputtering. Each Ag—Ce alloy layer 17 may have a thickness of about 40 nm-80 nm. Each Ag—Ce alloy layer 17 contains about 20%-30% cerium and 70%-80% silver by atomic percentage. Each Ag—Ce alloy layer 17 has a portion that imbeds in the porous structure of the adjacent two Ni—Cr—N layers 15. As such, the Ag—Ce alloy layers 17 are securely attached to the Ni—Cr—N layers 15 and the silver or cerium ions with an antibacterial property within the Ag—Ce alloy layers 17 will not be dissolved rapidly, thus the Ag—Ce alloy layers 17 have long-lasting antibacterial effect. Furthermore, the outermost Ni—Cr—N layer 15 will protect the Ag—Ce alloy layers 17 from abrasion, which further prolongs the antibacterial effect of the coated article 10.

A method for making the coated article 10 may include the following steps:

The substrate 11 is pre-treated, such pre-treating process may include the following steps:

The substrate 11 is cleaned in an ultrasonic cleaning device (not shown) filled with ethanol or acetone.

Figure 2:
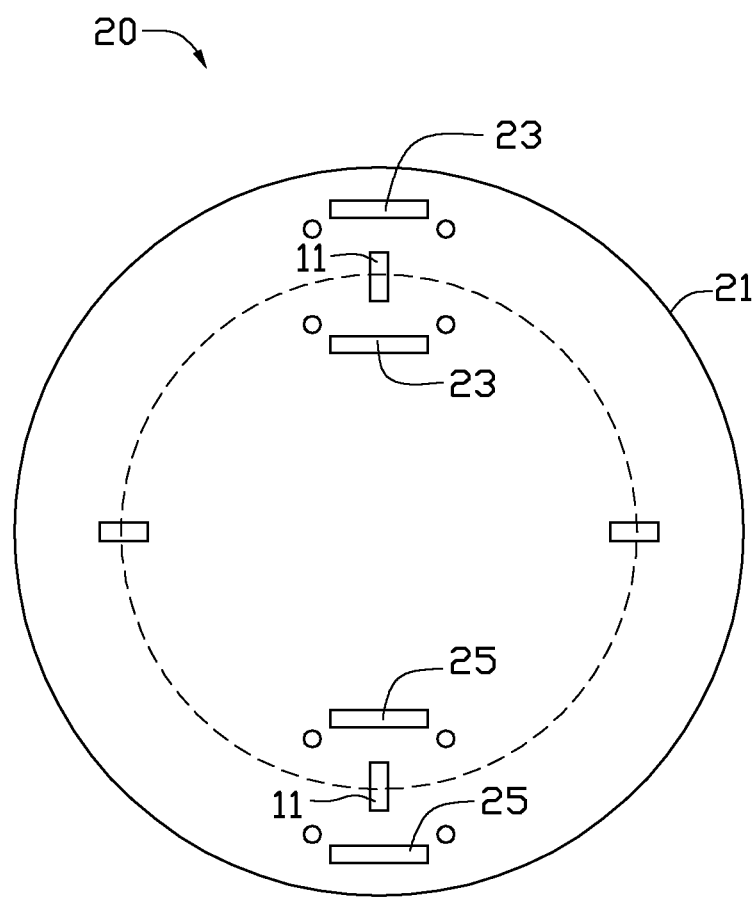
FIG. 2 is an overhead view of an exemplary embodiment of a vacuum sputtering device.

The substrate 11 is plasma cleaned. Referring to FIG. 2, the substrate 11 may be positioned in a coating chamber 21 of a vacuum sputtering device 20. The coating chamber 21 is fixed with nickel-chromium (Ni—Cr) alloy targets 23 and silver-cerium (Ag—Ce) alloy targets 25. The mass percentage of nickel and chromium in the Ni—Cr alloy targets 23 may be respectively about 20%-40% and about 60%-80%. The mass percentage of silver and cerium in the Ag—Ce alloy targets 25 may be respectively about 40%-60%. The coating chamber 21 is then evacuated to about $4.0 \times 10^{-3}$ Pa. Argon gas (Ar) having a purity of about 99.999% may be used as a working gas and is fed into the coating chamber 21 at a flow rate of about 500 standard-state cubic centimeters per minute (sccm). The substrate 11 may have a bias voltage of about −200 V to about −350 V, then high-frequency voltage is produced in the coating chamber 21 and the argon gas is ionized to plasma. The plasma then strikes the surface of the substrate 11 to clean the surface of the substrate 11. Plasma cleaning of the substrate 11 may take about 3 minutes (min)-10 min. The plasma cleaning process enhances the bond between the substrate 11 and the bonding layer 13. The Ni—Cr alloy targets 23 and the Ag—Ce alloy targets 25 are unaffected by the pre-cleaning process.

The bonding layer 13 may be magnetron sputtered on the pretreated substrate 11 by using a direct current power on the nickel-chromium alloy targets 23. Magnetron sputtering of the bonding layer 13 is implemented in the coating chamber 21. The inside of the coating chamber 21 is heated to about 70° C.-90° C. Argon gas may be used as a working gas and is fed into the coating chamber 21 at a flow rate of about 350 sccm-500 sccm. The direct current power is applied to the nickel-chromium alloy targets 23, and nickel atoms and chromium atoms are sputtered off from the nickel-chromium alloy targets 23 to deposit the bonding layer 13 on the substrate 11. During the depositing process, the substrate 11 may have a bias voltage of about −100 V to about −150 V. Depositing of the bonding layer 13 may take about 5 min-10 min.

One of the Ni—Cr—N layers 15 may be magnetron sputtered on the bonding layer 13 by using a direct current power on the nickel-chromium alloy targets 23. Magnetron sputtering of the Ni—Cr—N layer 15 is implemented in the coating chamber 21. The internal temperature of the coating chamber 21 is maintained at about 70° C.-90° C. Nitrogen ($N_2$) may be used as a reaction gas and is fed into the coating chamber 21 at a flow rate of about 45 sccm-120 sccm. Argon gas may be used as a working gas and is fed into the coating chamber 21 at a flow rate of about 400 sccm-500 sccm. The direct current power at a level of about 7 kilowatt (KW) to about 11 KW is applied on the nickel-chromium alloy targets 23, and then nickel atoms and chromium atoms are sputtered off from the nickel-chromium alloy targets 23. The nickel atoms, chromium atoms and nitrogen atoms are ionized in an electrical field in the coating chamber 21. The ionized nickel and chromium atoms then chemically react with the ionized nitrogen to deposit the Ni—Cr—N layer 15 on the bonding layer 13. During the depositing process, the substrate 11 may have a direct current bias voltage of about −50 V to about −100 V. Depositing of the Ni—Cr—N layer 15 may take about 5 min-7 min.

One of the Ag—Ce alloy layers 17 may be magnetron sputtered on the Ni—Cr—N layer 15 by using a direct current power of 8 KW-10 KW on the Ag—Ce alloy targets 25. Magnetron sputtering of the Ag—Ce alloy layer 17 is implemented in the coating chamber 21. The internal temperature of the coating chamber 21 is maintained at about 70° C.-90° C. Argon gas may be used as a working gas and is fed into the coating chamber 21 at a flow rate of about 400 sccm-500 sccm. The direct current power is applied on the Ag—Ce alloy targets 25, and then Ag atoms and Ce atoms are sputtered off from the Ag—Ce alloy targets 25 to deposit the Ag—Ce alloy layer 17 on the Ni—Cr—N layer 15. During the depositing process, the substrate 11 may have a direct current bias voltage of about −50 V to about −100 V. Depositing of the Ag—Ce alloy layer 17 may take about 5 min-7 min.

The steps of magnetron sputtering the Ni—Cr—N layer 15 and the Ag—Ce alloy layer 17 are repeated about 13-19 times to form the coated article 10. In this embodiment, one more Ni—Cr—N layer 15 may be magnetron sputtered on the Ag—Ce alloy layer 17 and the Ni—Cr—N layer 15 forms the outermost layer of the coated article 10.

Specific examples of making the coated article 10 are described as follows. The pre-treating process of ultrasonic cleaning the substrate 11 in these specific examples may be substantially the same as previously described so it is not described here again. Additionally, the magnetron sputtering processes of the bonding layer 13, Ni—Cr—N layer 15, and Ag—Ce alloy layer 17 in the specific examples are substantially the same as described above, and the specific examples mainly emphasize the different process parameters of making the coated article 10.

Example 1

The substrate 11 is made of stainless steel.
Plasma cleaning of the substrate 11: the flow rate of Ar is 500 sccm; the substrate 11 has a bias voltage of −200 V; plasma cleaning of the substrate 11 takes 5 min.

Sputtering to form the bonding layer 13 on the substrate 11: the flow rate of Ar is 420 sccm; the substrate 11 has a bias voltage of −100 V; the Ni—Cr alloy targets 23 are applied with a power of 7 KW; the mass percentage of nickel in the Ni—Cr alloy target 23 is 35%; the internal temperature of the coating chamber 21 is 80° C.; sputtering of the bonding layer 13 takes 6 min; the bonding layer 13 has a thickness of 185 nm.

Sputtering to form Ni—Cr—N layer 15 on the bonding layer 13: the flow rate of Ar is 400 sccm, the flow rate of $N_2$ is 60 sccm; the substrate 11 has a bias voltage of −80 V; the Ni—Cr alloy targets 23 are applied with a power of 8 KW; the internal temperature of the coating chamber 21 is 80° C.; sputtering of the Ni—Cr—N layer 15 takes 7 min; the Ni—Cr—N layer 15 has a thickness of 75 nm.

Sputtering to form Ag—Ce layer 17 on the Ni—Cr—N layer 15: the flow rate of Ar is 400 sccm; the substrate 11 has a bias voltage of −80 V; the Ag—Ce alloy targets 25 are applied with a power of 8 KW; the mass percentage of silver in the Ag—Ce alloy target 25 is 45%; the internal temperature of the coating chamber 21 is 80° C.; sputtering of the Ag—Ce layer 17 takes 7 min; the Ag—Ce layer 17 has a thickness of 70 nm.

The step of sputtering the Ni—Cr—N layer 15 is repeated 17 times, and the step of sputtering the Ag—Ce alloy layer 17 is repeated 16 times.

Example 2

The substrate 11 is made of stainless steel.
Plasma cleaning of the substrate 11: the flow rate of Ar is 500 sccm; the substrate 11 has a bias voltage of −200 V; plasma cleaning of the substrate 11 takes 5 min.

Sputtering to form the bonding layer 13 on the substrate 11: the flow rate of Ar is 420 sccm; the substrate 11 has a bias voltage of −100 V; the Ni—Cr alloy targets 23 are applied with a power of 7 KW; the mass percentage of nickel in the Ni—Cr alloy target 23 is 40%; the internal temperature of the coating chamber 21 is 80° C.; sputtering of the bonding layer 13 takes 5 min; the bonding layer 13 has a thickness of 185 nm.

Sputtering to form Ni—Cr—N layer 15 on the bonding layer 13: the flow rate of Ar is 400 sccm, the flow rate of $N_2$ is 100 sccm; the substrate 11 has a bias voltage of −80 V; the Ni—Cr alloy targets 23 are applied with a power of 7 KW; the internal temperature of the coating chamber 21 is 80° C.; sputtering of the Ni—Cr—N layer 15 takes 5 min; the Ni—Cr—N layer 15 has a thickness of 60 nm.

Sputtering to form Ag—Ce layer 17 on the Ni—Cr—N layer 15: the flow rate of Ar is 400 sccm; the substrate 11 has a bias voltage of −80 V; the Ag—Ce alloy targets 25 are applied with a power of 8 KW; the mass percentage of silver in the Ag—Ce alloy target 25 is 45%; the internal temperature of the coating chamber 21 is 80° C.; sputtering of the Ag—Ce layer 17 takes 5 min; the Ag—Ce layer 17 has a thickness of 65 nm.

The step of sputtering the Ni—Cr—N layer 15 is repeated 17 times, and the step of sputtering the Ag—Ce alloy layer 17 is repeated 16 times.

An antibacterial performance test has been performed on the coated articles 10 described in the above examples 1-2. The test was carried out as follows:

Bacteria was firstly dropped on the coated article 10 and then covered by a sterilization film and put in a sterilization culture dish for about 24 hours at a temperature of about 37±1° C. and a relative humidity (RH) of more than 90%. Secondly, the coated article 10 was removed from the sterilization culture dish, and the surface of the coated article 10 and the sterilization film were rinsed using 20 milliliter (ml) wash liquor. The wash liquor was then collected in a nutrient agar to inoculate the bacteria for about 24 hours to 48 hours at about 37±1° C. After that, the number of surviving bacteria was counted to calculate the bactericidal effect of the coated article 10.

The test result indicated that the bactericidal effect of the coated article 10 with regard to *escherichia coli, salmonella*, and *staphylococcus aureus* was no less than 99.999%. Furthermore, after having been immersed in water for about three months at about 37±1° C., the bactericidal effect of the coated article 10 on *escherichia coli, salmonella*, and *staphylococcus aureus* was no less than 95%.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a bonding layer formed on the substrate, the bonding layer being a nickel-chromium alloy layer; and
   a plurality of alternating nickel-chromium-nitrogen layers and silver-cerium alloy layers formed on the bonding layer, one of the nickel-chromium-nitrogen layers being directly formed on the bonding layer;
   wherein the nickel-chromium-nitrogen layers have porous structure, each silver-cerium alloy layer has a portion embedded in the porous structure of the adjacent nickel-chromium-nitrogen layers.

2. The coated article as claimed in claim 1, wherein one of the nickel-chromium-nitrogen layers forms an outermost layer of the coated article.

3. The coated article as claimed in claim 1, wherein the substrate is made of stainless steel.

4. The coated article as claimed in claim 1, wherein each nickel-chromium-nitrogen layer has a thickness of about 40 nm-80 nm.

5. The coated article as claimed in claim 1, wherein each nickel-chromium-nitrogen layer contains about 30%-45% nickel by atomic percentage, about 40%-55% chromium by atomic percentage, and about 5%-15% nitrogen by atomic percentage.

6. The coated article as claimed in claim 1, wherein each silver-cerium alloy layer has a thickness of about 40 nm-80 nm.

7. The coated article as claimed in claim 1, wherein each silver-cerium alloy layer contains about 20%-30% cerium and 70%-80% silver by atomic percentage.

8. The coated article as claimed in claim 1, wherein the nickel-chromium-nitrogen layers and the silver-cerium alloy layers have a total thickness of about 2 μm-3.2 μm.

9. The coated article as claimed in claim 1, wherein the bonding layer has a thickness of about 150 nm-250 nm.

* * * * *